United States Patent
Hung et al.

(10) Patent No.: US 7,975,111 B2
(45) Date of Patent: Jul. 5, 2011

(54) MEMORY AND METHOD APPLIED IN ONE PROGRAM COMMAND FOR THE MEMORY

(75) Inventors: Chun-Hsiung Hung, Hsinchu (TW); Wen-Chiao Ho, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 387 days.

(21) Appl. No.: 12/270,722

(22) Filed: Nov. 13, 2008

(65) Prior Publication Data

US 2010/0122043 A1 May 13, 2010

(51) Int. Cl.
*G06F 13/00* (2006.01)
(52) U.S. Cl. .......................... 711/154; 711/103; 711/163
(58) Field of Classification Search ................... 711/103, 711/154, 163
See application file for complete search history.

(56) References Cited

U.S. PATENT DOCUMENTS

| | | | | |
|---|---|---|---|---|
| 5,754,567 | A * | 5/1998 | Norman | 714/773 |
| 6,016,472 | A * | 1/2000 | Ali | 704/500 |
| 2003/0149856 | A1* | 8/2003 | Cernea | 711/202 |
| 2005/0050135 | A1* | 3/2005 | Hallermeier | 709/200 |
| 2005/0120266 | A1* | 6/2005 | Cernea | 714/8 |
| 2009/0132755 | A1* | 5/2009 | Radke | 711/103 |

* cited by examiner

*Primary Examiner* — Reba I. Elmore
(74) *Attorney, Agent, or Firm* — J.C. Patents

(57) ABSTRACT

A memory and a method applied in one program command for the memory are provided. The memory includes a buffer and at least one program unit. The method includes the following steps. First, enter the program command to the memory. Next, enter user data to the buffer. Read the data of the program unit. Determine whether the user data fill the buffer. Fill the part of the buffer unoccupied by the user data with the data of the program unit if the user data do not fill the buffer. Erase the program unit if the program unit is not empty. Finally, program the data of the buffer into the program unit.

16 Claims, 3 Drawing Sheets

US 7,975,111 B2

MEMORY AND METHOD APPLIED IN ONE PROGRAM COMMAND FOR THE MEMORY

BACKGROUND OF THE INVENTION

1. Field of the Invention

The present invention relates to a non-volatile memory. More particularly, the present invention relates to a program function of a non-volatile memory.

2. Description of the Related Art

Non-volatile memories can retain data in the absence of power supply. This is an advantage over volatile memories. However, operation of non-volatile memories is more complex than that of volatile memories. For example, in a program operation, the data bits of a non-volatile memory can be changed from one to zero but cannot be changed from zero to one. Therefore, before programming a non-empty sector of a non-volatile memory, an erase operation is required to reset all bits of the non-empty sector to one.

Usually, a conventional non-volatile memory can handle a write request whose data size is as small as one page as program unit, for example, 512 bytes. By contrast, a sector is the minimum erase unit of a non-volatile memory. The size of a sector ranges from 32K bytes or more, i.e. the erase unit is greater or equal to the program unit. The program unit usually has the same size with a buffer. In order to increase the write speed, the write unit tends to become bigger. However, the write unit will still be kept smaller than or equal to the erase unit in the future. If the size of the user data to be programmed into a non-volatile memory does not completely align with the sector boundary, the original data of the sector have to be read out first and be programmed back into the sector along with the user data in order to preserve the original data in the sector.

The program function of a conventional non-volatile memory does not check whether the target sector is empty or not. The program function of a conventional non-volatile memory does not check whether the size of the user data aligns with the sector boundary or not. Because of the aforementioned reasons, conventional non-volatile memories need external flow control to implement proper and safe operations.

SUMMARY OF THE INVENTION

Accordingly, the present invention is directed to a memory and a method applied in one program command for the memory. The method implements a new program function for non-volatile memories. The new program function performs several operations in response to a single program command, including preserving original data and a necessary erase operation before programming a non-empty program unit. With this new program function, the proposed memory takes care of all related details for the user and is more user-friendly. In addition, the proposed memory controls the flow of the new program function by itself. Therefore the proposed memory does not need any external micro-controller to control the flow of programming and reduces the overall system cost.

According to an embodiment of the present invention, a method applied in one program command for a memory is provided. The memory includes a buffer and at least one program unit. The method includes the following steps. First, enter the program command to the memory. Next, enter user data to the buffer. Read the data of the program unit. Determine whether the user data fill the buffer. Fill the part of the buffer unoccupied by the user data with the data of the program unit if the user data do not fill the buffer. Erase the program unit if the program unit is not empty. Finally, program the data of the buffer into the program unit.

In an embodiment of the present invention, the address range of the program unit is a superset of the address range of the user data. The address range of the data of the program unit used to fill the part of the buffer is the address range of the entire program unit excluding the address range of the user data. The data of the program unit are filled into the part of the buffer in the same address arrangement as in the program unit so that contents and positions of the filled data are preserved after the programming of the data of the buffer into the program unit.

According to another embodiment of the present invention, a memory is provided. The memory includes a memory array, a buffer, and a program circuit. The memory array includes a program unit. The buffer is coupled to the memory array for receiving user data. The program circuit is coupled to the buffer and the memory array for receiving a program command. In response to the program command, the program circuit reads data of the program unit, determines whether the user data fill the buffer, fills the part of the buffer unoccupied by the user data with the data of the program unit if the user data do not fill the buffer, erases the program unit if the program unit is not empty, and programs data of the buffer into the program unit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
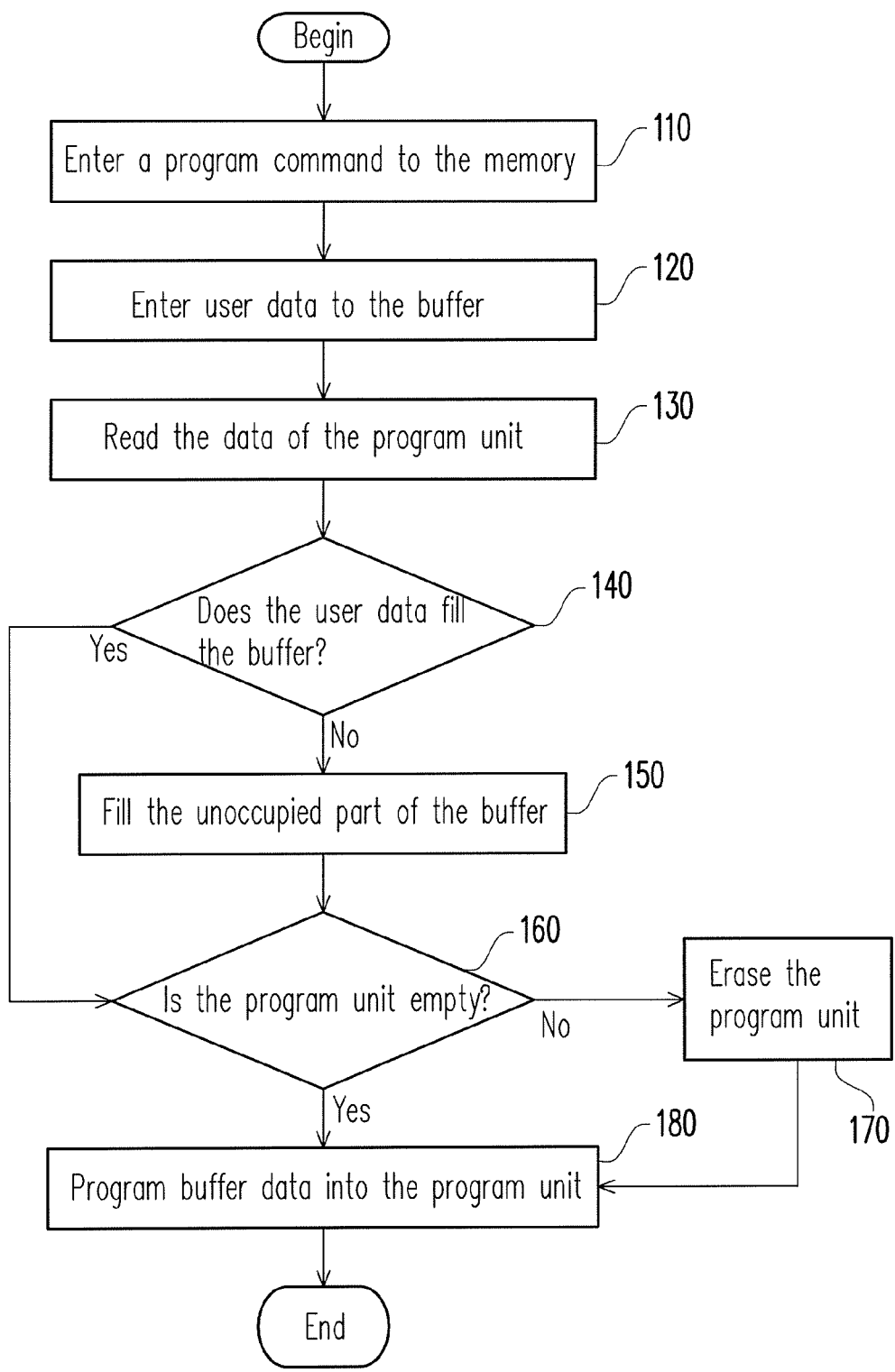
FIG. 1 is a flow chart of a method applied in one program command for a memory according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
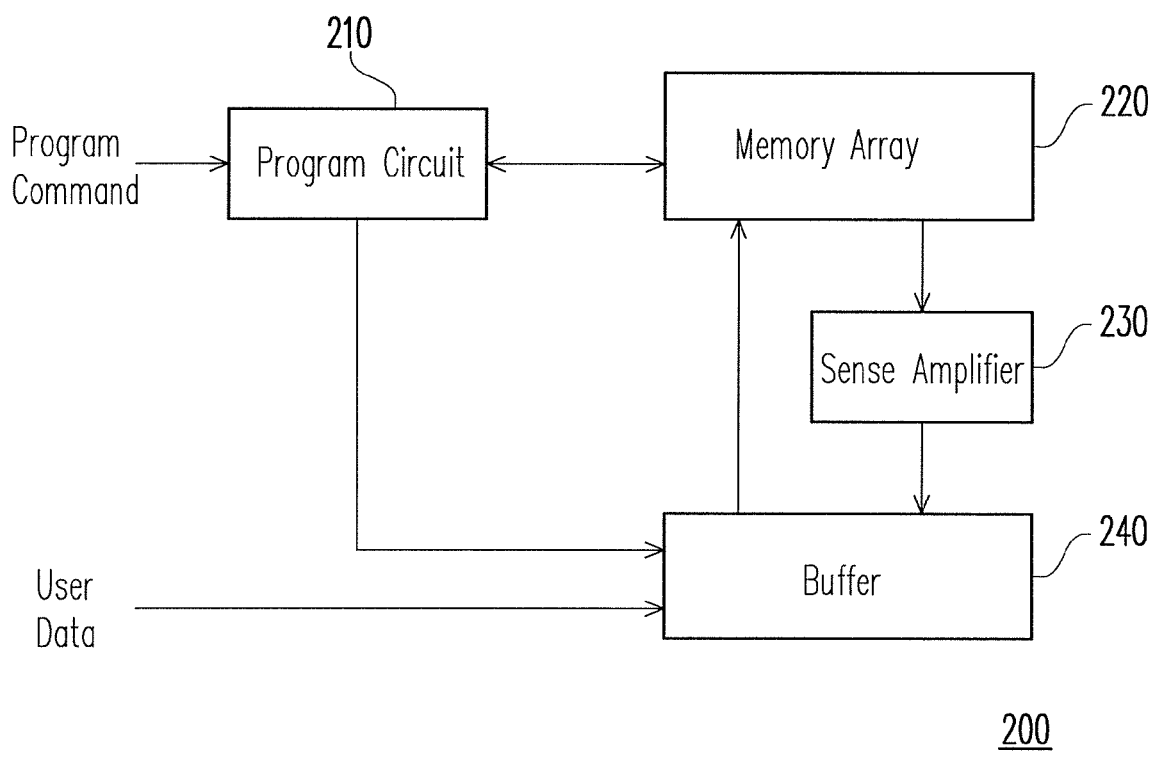
FIG. 2 is a schematic diagram showing a memory according to an embodiment of the present invention.
Figure 3:
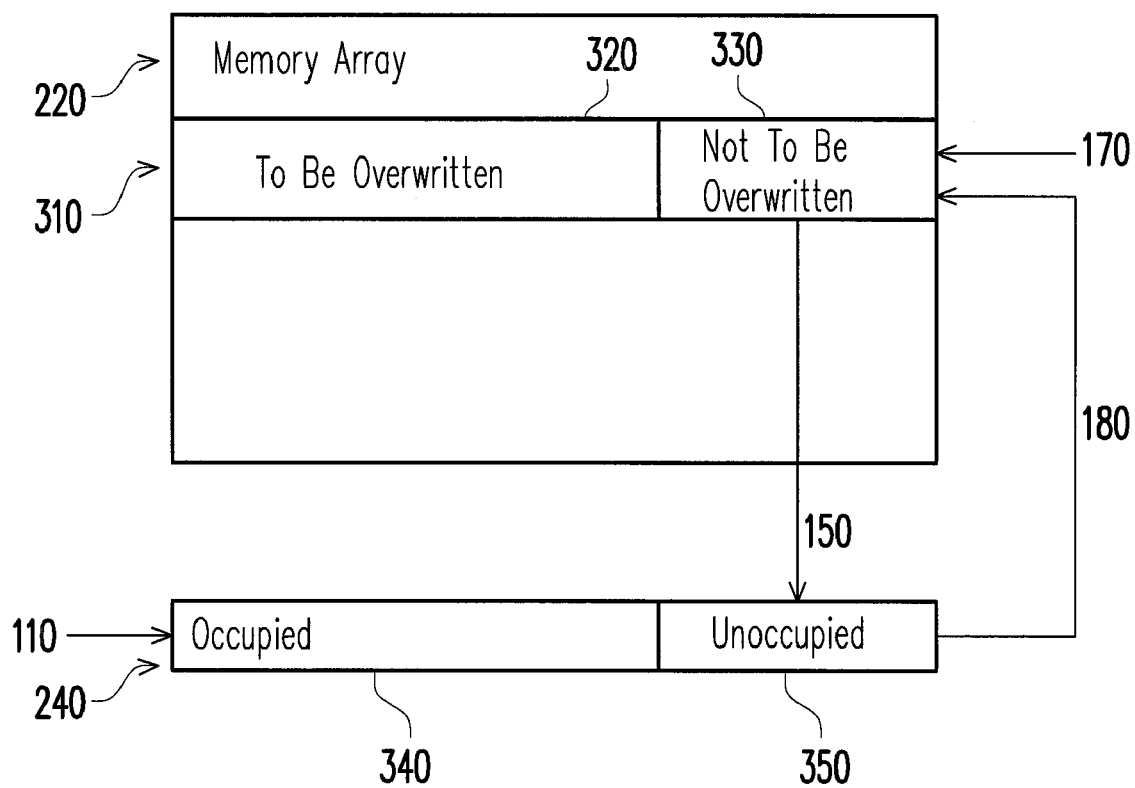
FIG. 3 is a schematic diagram showing the data flow of the memory array and the buffer in FIG. 2.

Please refer to FIG. 1, FIG. 2, and FIG. 3. FIG. 1 is the flow chart of a method applied in one program command for a memory according to an embodiment of the present invention. The method in FIG. 1 implements a new program function for non-volatile memories. FIG. 2 is a schematic diagram showing the aforementioned memory 200 according to this embodiment. FIG. 3 is a schematic diagram showing the data flow of the memory array 220 and the buffer 240 in FIG. 2. The memory 200 is a non-volatile memory, such as a flash memory. The memory 200 includes a program circuit 210, a memory array 220, a sense amplifier 230, and a buffer 240. The memory array 220 includes multiple program units. The buffer 240 is coupled to the memory array 220 and receives the user data to be programmed into a program unit of the memory array 220. The sense amplifier 230 is coupled between the memory array 220 and the buffer 240 for amplifying and providing the data of the program units into the buffer 240. The program circuit 210 is coupled to the buffer 240 and the memory array 220 for receiving a program command and executes the new program function in response to the program command.

The aforementioned program unit is the minimum erase unit of the memory array 220. The program units are also known as sectors of the memory array 220. The size of the buffer 240 is equal to the size of a program unit.

The following is the discussion of the flow in FIG. 1. In this embodiment of the present invention, the user data are to be programmed into the program unit 310 of the memory array 220 shown in FIG. 3. First, a program command is entered to the program circuit 210 (step 110). Next, the user data are entered into the buffer 240 (step 120). In response to the program command, the program circuit 210 executes the new program function proposed in this embodiment including steps 130-180 in FIG. 1.

After receiving the program command, the program circuit 210 reads all data of the program unit 310 (step 130). The data read from the program unit 310 are used in steps 150 and 160, which are discussed below. Next, the program circuit 210 checks whether the user data fills the entire buffer 240 or not (step 140). If the user data fills the entire buffer 240, the flow proceeds directly to step 160.

If the user data does not fill the entire buffer 240, as depicted in FIG. 3, the flow proceeds to step 150. In this case, the buffer 240 may be divided into two parts, namely, the part 340 occupied by the user data and the part 350 unoccupied by the user data. Accordingly, the program unit 310 may be divided into two parts, namely, the part 320 to be overwritten by the user data and the part 330 not to be overwritten. Since the user data are to be programmed into the program unit 310, the buffer 240 and the program unit 310 are corresponding to the same address range in the memory array 220. In other words, the address range of the program unit 310 is a superset of the address range of the user data. In order to preserve the original data in the part 330 of the program unit 310, the program circuit 210 fills the part 350 of the buffer 240 with the data of the part 330 of the program unit 310 (step 150). Obviously, the address range of the data used to fill the part 350 of the buffer 240 is the address range of the entire program unit 310 excluding the address range of the user data. The data of the part 330 of the program unit 310 are filled into the part 350 of the buffer 240 in the same address arrangement as in the program unit 310 so that contents and positions of the filled data are preserved after the program circuit 210 programs the data of the buffer 240 into the program unit 310.

Next, the program circuit 210 determines whether the program unit 310 is empty or not according to the data read in step 130 (step 160). The program circuit 210 determines the program unit 310 to be empty if all bits of the program unit 310 have the same predetermined value. The predetermined value is one in this embodiment. If the program unit 310 is empty, the flow proceeds directly to step 180. If the program unit 310 is not empty, the program circuit 210 erases the program unit 310 by setting all the bits of the program unit 310 to the aforementioned predetermined value (step 170). Next, the program circuit 210 programs the data of the entire buffer 240 into the program unit 310 and completes the proposed new program function (step 180).

In summary, the method shown in FIG. 1 and the memory 200 shown in FIG. 2 define and implement a new program function for non-volatile memories. The new program function integrates many necessary operations and is automatically executed by the program circuit 210 of the memory 200 in response to a single program command. The user of the memory 200 does not have to check whether the program unit is empty or not. The user of the memory 200 does not have to check whether the user data fills the entire buffer 240 or not. In response to a single program command, the new program function knows to preserve the original data of the target program unit when the size of the user data is smaller than that of the program unit, and to erase the program unit first when the program unit is non-empty. As a result, the proposed new program function is smarter and more convenient than conventional program functions.

In addition, the program circuit in this embodiment is a simple logic circuit that is specifically designed for executing the new program function. Consequently the program circuit costs much less and occupies much less chip area than conventional general purpose micro-controllers do. Without the built-in program circuit, the user has to rely on an expensive micro-controller to control the flow in FIG. 1. The adoption of the program circuit of this embodiment reduces cost and chip area of the overall system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method applied in one program command for a memory, the memory comprising a buffer and at least one program unit, the method comprising steps of:
   entering the program command to the memory;
   entering user data to the buffer;
   reading data of the program unit;
   determining whether the user data fills the buffer;
   filling a part of the buffer unoccupied by the user data with the data of the program unit if the user data does not fill the buffer;
   erasing the program unit if the program unit is not empty; and
   programming data of the buffer into the program unit.

2. The method of claim 1, wherein the memory is a non-volatile memory.

3. The method of claim 1, wherein a size of the buffer is equal to a size of the program unit.

4. The method of claim 1, wherein a size of the buffer is equal to a size of an erase unit of the memory.

5. The method of claim 1, wherein an address range of the program unit is a superset of an address range of the user data.

6. The method of claim 5, wherein an address range of the data of the program unit used to fill the part of the buffer is the address range of the entire program unit excluding the address range of the user data.

7. The method of claim 6, wherein the data of the program unit are filled into the part of the buffer in a same address arrangement as in the program unit so that contents and positions of the filled data are preserved after the programming of the data of the buffer into the program unit.

8. The method of claim 1, wherein the program unit is determined to be empty if all bits of the program unit have a same predetermined value, and the program unit is erased by setting all the bits of the program unit to the same predetermined value.

9. A memory, comprising:
   a memory array comprising a program unit;
   a buffer coupled to the memory array for receiving user data; and
   a program circuit coupled to the buffer and the memory array for receiving a program command, wherein, in response to the program command, the program circuit reads data of the program unit, determines whether the user data fills the buffer, fills a part of the buffer unoccupied by the user data with the data of the program unit if the user data does not fill the buffer, erases the program unit if the program unit is not empty, and programs data of the buffer into the program unit.

10. The memory of claim 9, wherein the memory is a non-volatile memory.

11. The memory of claim 9, wherein a size of the buffer is equal to a size of the program unit.

12. The memory of claim 9, wherein a size of the buffer is equal to a size of an erase unit of the memory array.

13. The memory of claim 9, wherein an address range of the program unit is a superset of an address range of the user data.

14. The memory of claim 13, wherein an address range of the data of the program unit used to fill the part of the buffer is the address range of the entire program unit excluding the address range of the user data.

15. The memory of claim 14, wherein the program circuit fills the data of the program unit into the part of the buffer in a same address arrangement as in the program unit so that contents and positions of the filled data are preserved after the program circuit programs the data of the buffer into the program unit.

16. The memory of claim 9, wherein the program circuit determines the program unit to be empty if all bits of the program unit have a same predetermined value, and the program circuit erases the program unit by setting all the bits of the program unit to the same predetermined value.

* * * * *